United States Patent [19]

Vogeli

[11] Patent Number: 5,514,223
[45] Date of Patent: May 7, 1996

[54] DUAL DISCHARGE PHOTOVOLTAIC MODULE

[75] Inventor: Craig N. Vogeli, New Baltimore, Mich.

[73] Assignee: United Solar Systems Corporation, Troy, Mich.

[21] Appl. No.: 389,949

[22] Filed: Feb. 17, 1995

[51] Int. Cl.$^6$ .................................................. H01L 31/05
[52] U.S. Cl. .................. 136/244; 136/293; 323/906; 323/304; 318/139; 307/52; 307/63; 307/72; 307/84; 307/86; 307/87; 307/116; 307/126; 307/131
[58] Field of Search .................................. 136/244, 293; 307/52, 63, 72, 75–78, 84–87, 116, 126, 131; 323/906, 304; 318/139

[56] References Cited

U.S. PATENT DOCUMENTS

| | | | |
|---|---|---|---|
| 4,100,427 | 7/1978 | Durand et al. | 307/87 |
| 4,175,249 | 11/1979 | Gruber . | |
| 4,327,318 | 4/1982 | Kwon et al. | 320/39 |
| 4,367,365 | 1/1983 | Spencer | 136/244 |
| 4,456,782 | 6/1984 | Nishiura et al. | 136/244 |
| 4,483,319 | 11/1984 | Dinh | 126/646 |
| 4,489,243 | 12/1984 | Nola | 307/64 |
| 4,571,532 | 2/1986 | Jaster | 320/2 |
| 4,614,879 | 9/1986 | Ault | 307/130 |
| 4,620,140 | 10/1986 | Chonan . | |
| 4,714,352 | 12/1987 | Ganter | 368/64 |
| 4,785,226 | 11/1988 | Fujisawa et al. | 320/21 |
| 5,001,415 | 3/1991 | Watkinson | 323/906 |

FOREIGN PATENT DOCUMENTS 3912283  12/1989  Germany .............. 136/293

OTHER PUBLICATIONS

E. E. Landsman, *13th IEEE Photovoltaic Specialists Conference* (1978), pp. 992–995.

*Primary Examiner*—Aaron Weisstuch
*Attorney, Agent, or Firm*—Gifford, Krass, Groh, Sprinkle, Patmore, Anderson & Citkowski

[57] ABSTRACT

A dual discharge photovoltaic module responsive to high and low loads. The module includes a first plurality of series connected, high short circuit current cells, and a second plurality of series connected, low short circuit current cells connected in series with the first plurality. A diode is connected in parallel with the second plurality of cells such that current flow through the module when the module is under low load reverse biases the diode so that the module discharges at a low current. When the module is under high load, current flow through the module forward biases the diode and bypasses the second plurality of cells so that the module discharges at a high rate. The module is particularly useful for starting and running an electric motor.

8 Claims, 2 Drawing Sheets

FIG - 1
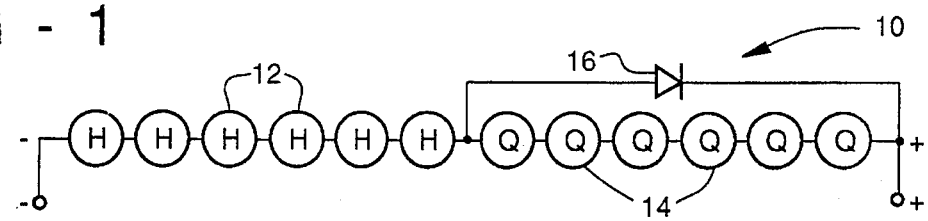
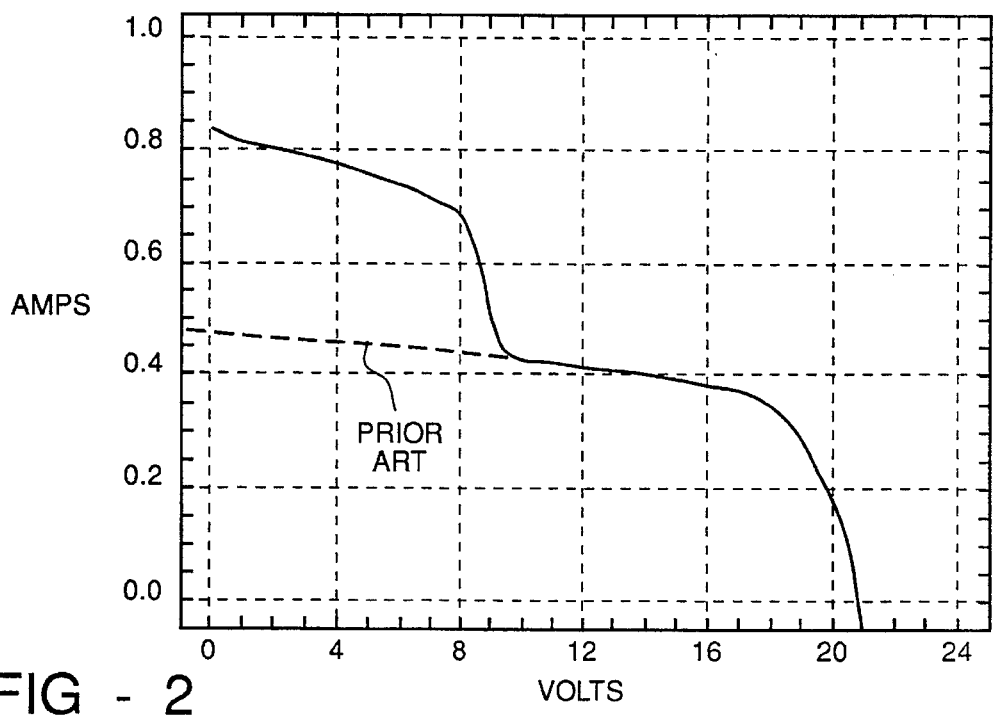
FIG - 2
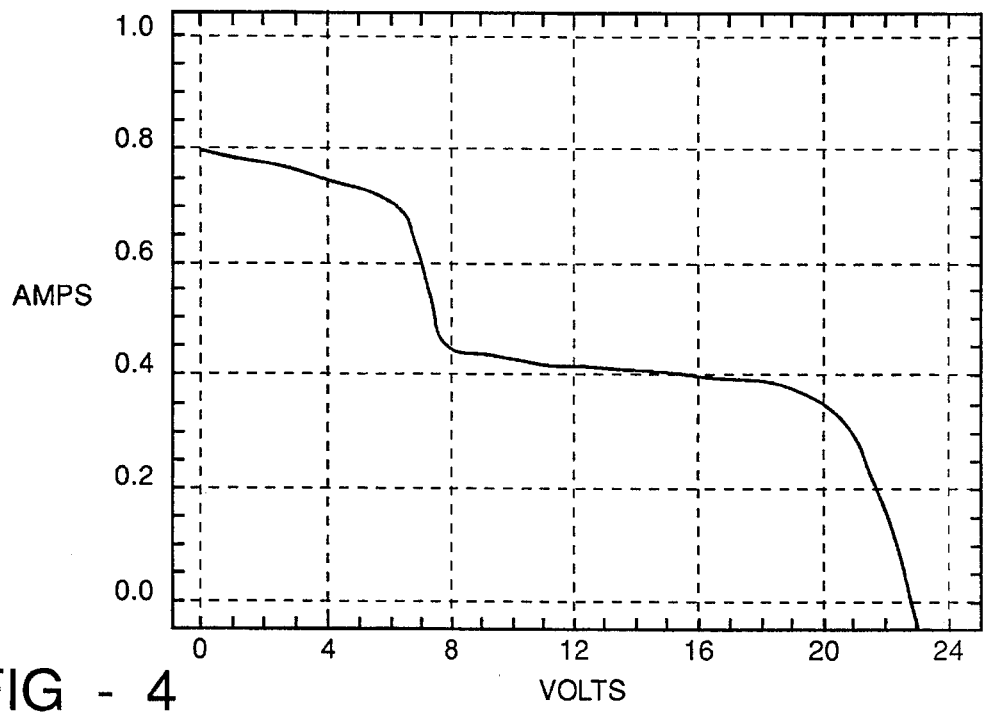
FIG - 4

DUAL DISCHARGE PHOTOVOLTAIC MODULE

FIELD OF THE INVENTION

This invention relates to photovoltaic power systems, and more particularly to such a system having dual discharge capabilities responsive to high and low power demands.

BACKGROUND OF THE RELEVANT PRIOR ART

The use of photovoltaic systems, which convert incident sunlight into electrical energy, has become increasingly popular in recent years. The development of more efficient solar cells, as well as the lower production costs realized in the manufacture of continuously deposited, amorphous solar cells, has made such power systems more practical. For example, photovoltaic modules are being used to power devices such as radios, to trickle charge batteries in parked cars, and in night illumination systems.

Of course, it would also be useful to employ photovoltaic power to operate electric motors such as, for example, electric fans, refrigerators, hot water pumps, etc. However, one problem which arises when employing photovoltaics to operate electric motors results from the relatively high currents which must be used to start the typical electric motor, even a relatively small one. Thus, prior art photovoltaic power systems, while perfectly capable of providing enough current to run an electric motor, once started, are generally not sufficient to get the motor up and running. On the other hand, a power module which has sufficient capacity to start a motor will have a capacity far exceeding that needed to sustain operation of the motor. This excess capacity represents a loss in terms of material and space.

Of course, there have been some attempts in the prior art to solve this problem by employing such devices as accumulators, storage batteries and electronic sensing devices. U.S. Pat. Nos. 4,483,319 and 4,614,879 illustrate solar power supply systems for situations requiring a starting current which is higher than a minimum running current. In particular, the '319 patent discloses a circuit for starting a pump motor to operate a solar hot water system; the circuit includes a capacitor disposed between the photovoltaic panel and the pump. The pump is isolated from the capacitor until the voltage on the capacitor reaches a level sufficient to start the pump motor. The '879 patent discloses the use of an electronic regulator for adjusting panel output to provide for motor starting. U.S. Pat. No. 4,100,427 shows a photovoltaic power system employing a plurality of electric accumulators in the form of batteries which are connected to a plurality of photo cells. A switching means is provided for connecting a load to the photo cells only so that load current is determined by the photo cell current during the starting period of the load.

All known prior art systems suffer from one or more problems such as undue complexity, energy inefficiency, and unreliability. Clearly, there is a need for a photovoltaic power module which may be used to start and run an electric motor, which is reliable, simple in operation, and which makes efficient use of the energy generated. The present invention is directed to such a system.

SUMMARY OF THE INVENTION

Disclosed and claimed is a dual discharge photovoltaic module which is responsive to high and low loads, such as are encountered in starting and running an electric motor. The panel includes a first photovoltaic generator which is characterized by a high short circuit current; this first generator preferably comprises a first plurality of series connected, high current cells. The module further includes a second photovoltaic generator having a short circuit current lower than that of the first generator; in a preferred embodiment, the second generator comprises a plurality of series connected, low current cells. The first and second generators are connected in series, and a low voltage drop diode is connected in parallel with the second generator. The diode is connected such that current flow through the module when the module is under low load (such as running an electric motor) reverse biases the diode so that the diode blocks current flow and the panel discharges at a low current. When the module is under high load (such as encountered when starting the motor), current flow through the module forward biases the diode, thus rendering it conductive, and bypasses the second plurality of low current cells so that the module can discharge at a high rate. In effect, the diode is reverse biased under normal running conditions so that current flows through both generators; under high load, the diode becomes forward biased to shunt the low current, second generator out of the system.

In order for the dual discharge photovoltaic module to operate correctly, it is necessary that the first and second generators be mismatched with respect to current output. For example, the cells of the first generator may discharge at approximately twice the amperage (but at the same voltage) as the photovoltaic cells of the second generator. Since all of the photovoltaic cells are connected in series, the cells of the second plurality will effectively serve as current limiting elements as the load on the system increases. Since the diode is connected in parallel with the second plurality of cells and is reverse biased with respect to low load conditions, it will have no effect on the system when the system is under low load. However, the high current demands encountered when, for example, an electric motor is started, will exceed the capacity of the second generator, thereby building up a voltage thereacross which will cause the diode to become forward biased, therefore shunting the second generator out of the system; thus, the panel will discharge at the higher current characteristic of the first plurality of cells.

BRIEF DESCRIPTION OF THE DRAWINGS

The following detailed description is best understood by reference to the following drawings in which:

FIG. 1 is a block diagram showing a dual discharge photovoltaic panel in accordance with the teachings of the present invention;

FIG. 2 is a graph showing the discharge curve of the dual discharge photovoltaic panel of FIG. 1 wherein the abscissa represents voltage and the ordinate represents current, with the typical discharge curve of a prior art photovoltaic panel shown, in part, in phantom for comparison purposes;

FIG. 4 is a graph showing the discharge curve of the photovoltaic panel of FIG. 3 wherein the abscissa represents voltage and the ordinate represents current;

DETAILED DESCRIPTION OF THE PREFERRED EMBODIMENTS

Figure 3:
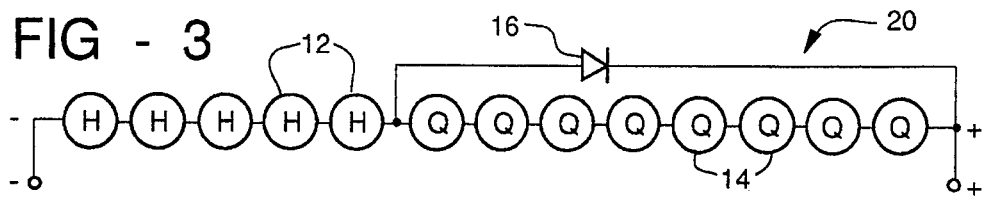
FIG. 3 is a block diagram showing an alternate embodiment of the dual discharge photovoltaic panel of the present invention in which the high current cells "kick in" at a lower voltage compared to the FIG. 1 embodiment.

Throughout the following detailed description, like numerals are used to reference the same element of the invention shown in multiple figures thereof. Referring now to the drawings, and in particular to FIG. 1, there is depicted a photovoltaic power module 10 constructed in accordance with the principles of the present invention. The power module 10 includes a first photovoltaic generator, which in this embodiment comprises a first plurality of high short circuit current photovoltaic cells 12 which are connected in series. The module 10 further includes a second photovoltaic generator, which in this embodiment comprises a second plurality of low short circuit current photovoltaic cells 14 which are also connected in series. As can be seen from FIG. 1, the pluralities of cells 12,14 are also connected in series with each other.

A diode 16 is connected in parallel with the second plurality of cells 14. Since conventional current flow is from the positive terminal to the negative terminal, it can be seen that the diode 16 is connected so that the current flow reverse biases the diode. The diode 16 is preferably a Schottky barrier diode. A particular diode is selected which has the electrical characteristics consistent with the rest of the circuit design.

For example, in the device of FIG. 1, the first plurality of cells 12 are each rated at 0.8 amps in current output, and have an open circuit voltage of 1.8 volts, and each of the second plurality of cells 14 are selected to have only 0.4 amps of current output with an open circuit voltage of 1.8 volts. The diode 16 is a low voltage drop diode, such as a Schottky diode having the following electrical characteristics: Vrrm=3 V, I(av)=1 A, $V_f$=0.55 V. Diodes of this type are available from the General Instrument Corporation under the designation IN5818. Other similar diodes, as well as other switching devices with similar characteristics may likewise be employed.

When a relatively low load such as that caused by the running of an electric motor is connected to the terminal of the module, the load will draw upon the power module 10 at a current which does not exceed the maximum current output of the second plurality of cells 14 (in this case 0.4 amps) and current will be drawn from both pluralities of cells. However, under high load conditions, such as would be caused by actually starting the motor, the load will draw a current that exceeds the capacity of the plurality of low current cells 14; in that situation, these cells 14 become reverse biased and a charge builds upon one side of the series. This buildup of charge causes the diode 16 to become forward biased so that current will pass through the diode. Since the diode 16 is connected in parallel with the second plurality of cells 14, the current will be shunted away from the low current cells 14 and through the diode 16. By shunting the low current cells 14 out of the circuit, the full 0.8 amps capacity of the first plurality of cells 12 is available to sustain the higher current demands. Thus, the device 10 of the present invention has dual discharge characteristics and may be used efficiently to both start and keep running an electric motor.

FIG. 2 depicts the power curve of the embodiment of the present invention shown in FIG. 1 with the electrical specifications set forth above. As is conventional, voltage is plotted along the horizontal axis, and current along the vertical axis. For comparison purposes, portions of a prior art, single discharge photovoltaic cell are shown in phantom, the remaining portion of the prior art photovoltaic cell overlapping with a portion of the power curve of the dual discharge device depicted in FIG. 1. The power curve of the prior art device remains relatively smooth for all voltages through the maximum voltage, approximately 23 volts (13 photovoltaic cells multiplied by 1.8 volts per cell). This prior art curve assumes that each of the 13 series connected cells has a power output of 0.4 amps and an open circuit voltage of 1.8 volts.

Figure 5:
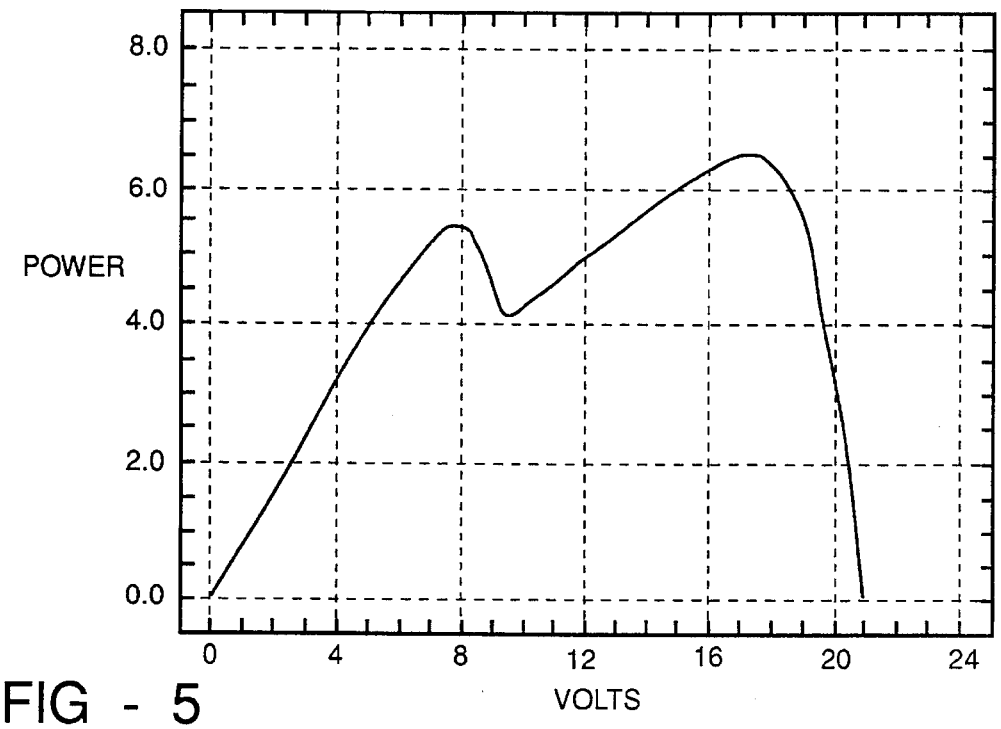
FIG. 5 is a graph showing the power output of the cell of FIG. 1 in watts plotted against voltage.

However, because of the two pluralities of cells of different discharge characteristics and the particular arrangement of the circuit shown in FIG. 1, the device 10 has the actual stepped discharge curve shown in FIG. 1. Thus, the device 10 has two plateaus of current discharge at approximately 0.8 amps and approximately 0.4 amps, depending on the load conditions. Furthermore, as can be seen from the curve shown in FIG. 5, which plots voltage against power output in watts, the module 10 will output at two peak levels of power.

Figure 6:
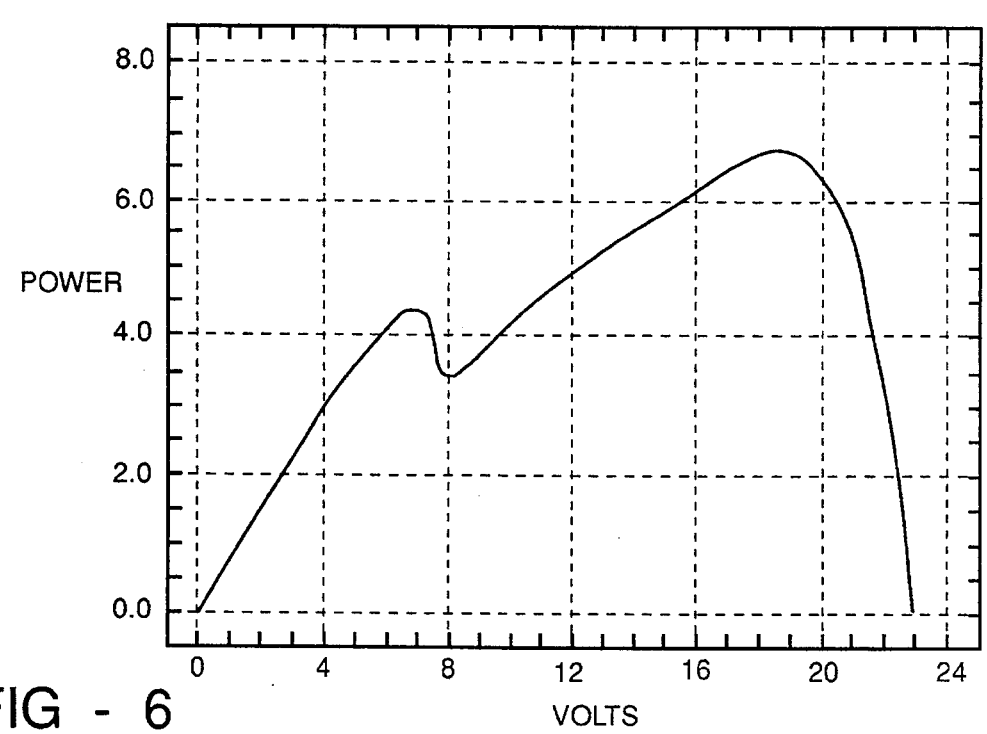
FIG. 6 is similar to FIG. 5, but shows the power output of the cell of FIG. 3 and the lower "kick in" voltage.

An alternate embodiment 20 of the dual discharge photovoltaic cell of the present invention is shown in FIG. 3. In contrast to the embodiment of FIG. 1, wherein the module 10 has equal pluralities of cells 12 and 14, each consisting of six individual cells, the module 20 shown in FIG. 3 has a larger plurality (8 cells) of low power cells 14 and a smaller plurality (5 cells) of high power cells 12. However, like the embodiment depicted in FIG. 1, the alternate embodiment 20 also has a diode 16 which is connected in parallel across all of the low current cells 14 and which is reverse biased with respect to the normal current flow. Thus, while it operates in a manner similar to the first embodiment 10, it has somewhat different performance characteristics. As can be seen by comparing its performance curves shown in FIGS. 4 and 6 with, respectively, FIGS. 2 and 5, the "kick in" voltage for the FIG. 3 embodiment is lower than for the FIG. 1 embodiment.

Of course, depending on the environment in which the panel is to be used and the load conditions under which it operates, a variety of different designs of the photovoltaic module of the present invention may be advantageously employed. For example, it may be desirable to have a module employing more high current cells than low current cells. In some instances, the device may comprise only two cells, one of high discharge capacity and the other of low discharge capacity. In some instances, it will be desirable to have a module with triple (or greater) discharge characteristics; and such a device could readily be constructed in accord with the present invention by employing additional diodes and additional sets of cells. Also, each individual cell may have different specifications than those described. However, such design variations are considered to be within the ambit of one skilled in the art without departing from the teachings of the present invention. It is the claims appended hereto and all reasonable equivalents thereof, rather than the depicted and described embodiments and exemplifications, which define the invention claimed herein.

I claim:

1. A dual discharge, photovoltaic module responsive to high and low current loads, said module comprising:

a first photovoltaic generator having a first short circuit current;

a second photovoltaic generator having a second short circuit current which is lower than said first short circuit current, connected in series with the first photovoltaic generator; and a diode connected in parallel with the second photovoltaic generator such that current flow through the module, when the module is under low current load, reverse biases the diode so that the diode is in a blocking condition and the module discharges at a low current; and current flow through the module when it is under high load, forward biases the diode so that the diode is in a conductive state and the current flow bypasses the second plurality of cells so that the module discharges at a high current.

2. The module of claim 1, wherein said first photovoltaic generator comprises a first plurality of series connected photovoltaic cells, and said second photovoltaic generator comprises a second plurality of series connected photovoltaic cells.

3. The module of claim 2 wherein the first plurality of cells is equal in number to the second plurality of cells.

4. The module of claim 2 wherein the first plurality of cells is greater in number than the second plurality of cells.

5. The module of claim 2 wherein each cell of the first plurality has a higher short circuit current than each cell of the second plurality.

6. The module of claim 5 wherein each cell of the first plurality has a short circuit current of 0.8 ampere, and an open circuit voltage of 1.8 volt, and each cell of the second plurality has a short circuit current of 0.4 ampere, and an open circuit voltage of 1.8 volt.

7. The module of claim 1 wherein the first plurality of cells is fewer in number than the second plurality of cells.

8. A circuit for starting and running an electrical motor comprising:
   an array of photovoltaic cells including:
      a first plurality of series connected cells, said first plurality having a first short circuit current;
      a second plurality of series connected cells, said second plurality having a second short circuit current which is less than said first short circuit current, said second plurality being connected in series with the first plurality; and
      a diode connected in parallel with the second plurality of cells such that a first level of current flow through the circuit when the motor is running reverse biases the diode so that current does not flow through the diode and the circuit discharges at a low current, and a second level of current flow when the motor is starting and which is greater than said first level forward biases the diode so that it remains conductive and current flow through the circuit bypasses the second plurality so that the circuit discharges at a high rate.

* * * * *